(12) United States Patent
Cheng et al.

(10) Patent No.: US 11,004,365 B2
(45) Date of Patent: May 11, 2021

(54) INTELLIGENT LED DISPLAY

(71) Applicant: SHENZHEN CREATELED ELECTRONICS CO., LTD., Guangdong (CN)

(72) Inventors: Zhuo Cheng, Shenzhen (CN); Jiangbo Tu, Shenzhen (CN); Anchun Tan, Shenzhen (CN); Lijian Luo, Shenzhen (CN)

(73) Assignee: SHENZHEN CREATELED ELECTRONICS CO., LTD., Guangdong (CN)

( * ) Notice: Subject to any disclaimer, the term of this patent is extended or adjusted under 35 U.S.C. 154(b) by 0 days.

(21) Appl. No.: 16/476,225

(22) PCT Filed: Jul. 26, 2018

(86) PCT No.: PCT/CN2018/097199
§ 371 (c)(1),
(2) Date: Jul. 5, 2019

(87) PCT Pub. No.: WO2019/076097
PCT Pub. Date: Apr. 25, 2019

(65) Prior Publication Data
US 2019/0355284 A1    Nov. 21, 2019

(30) Foreign Application Priority Data

Oct. 17, 2017   (CN) .......................... 201710965877.8

(51) Int. Cl.
*G09F 9/33*    (2006.01)
*H02J 9/04*    (2006.01)
(Continued)

(52) U.S. Cl.
CPC ................ *G09F 9/33* (2013.01); *H02J 9/04* (2013.01); *H05K 1/14* (2013.01); *H05K 1/181* (2013.01);
(Continued)

(58) Field of Classification Search
CPC ........ H05K 1/14; H05K 1/181; H05K 5/0017; H05K 5/0021; H05K 2201/10106; H05K 2201/10128
See application file for complete search history.

(56) References Cited

U.S. PATENT DOCUMENTS 6,729,054 B1 *   5/2004   VanderTuin .............. G09F 9/30
                                                           16/236
7,777,699 B2 *   8/2010   Varrin ...................... G09F 9/33
                                                           345/76

(Continued)

FOREIGN PATENT DOCUMENTS

CN   202335177 U   7/2012
CN   203607050 U   5/2014
(Continued)

OTHER PUBLICATIONS

PCT International Search Report; Application No. PCT/CN2018/097199; dated Nov. 1, 2018; 4 pages.

(Continued)

*Primary Examiner* — Xanthia C Cunningham
(74) *Attorney, Agent, or Firm* — Cantor Colburn LLP (57) ABSTRACT

A device relating to the technical field of LED display devices, and more particularly to an intelligent LED display which may be maintained at the front and the rear, may be fast assembled, supports intelligent connection of screens of the display, is light and slim, is integrated with receiving card and power supply, and has a power backup function. The intelligent LED display includes a unit display module (Continued)

assembly structure, a rear frame assembly structure, and a transverse fixed beam assembly structure. The unit display module assembly structure is connected at the front of the rear frame assembly structure through a magnetic attraction so that an intelligent LED display unit is formed, and the transverse fixed beam assembly structure is connected with the intelligent LED display unit in a hanging or seating manner.

15 Claims, 7 Drawing Sheets

(51) Int. Cl.
  *H05K 1/14* (2006.01)
  *H05K 1/18* (2006.01)
  *H05K 5/00* (2006.01)
(52) U.S. Cl.
  CPC ......... *H05K 5/0017* (2013.01); *H05K 5/0021* (2013.01); *H05K 2201/10106* (2013.01); *H05K 2201/10128* (2013.01)

(56) References Cited

U.S. PATENT DOCUMENTS

| | | | | |
|---|---|---|---|---|
| 8,042,698 B2* | 10/2011 | Kim | ................ | F16M 13/02 211/78 |
| 8,599,108 B2* | 12/2013 | Kline | ................ | G09G 3/22 345/46 |
| 9,074,742 B1* | 7/2015 | Petrocy | ................ | G09F 9/3026 |
| 9,235,072 B1* | 1/2016 | Yang | ................ | G06F 1/16 |
| 9,414,503 B2* | 8/2016 | Lee | ................ | H05K 5/0017 |
| 2007/0218411 A1* | 9/2007 | Sakata | ................ | G06F 1/1601 430/313 |
| 2009/0225506 A1* | 9/2009 | Lee | ................ | H05K 5/0204 361/679.21 |
| 2011/0108684 A1* | 5/2011 | Roessler | ................ | F16M 11/24 248/176.1 |
| 2011/0222221 A1* | 9/2011 | Hsu | ................ | F16M 11/22 361/679.01 |
| 2012/0224311 A1* | 9/2012 | Sutherland | ................ | G06K 9/00335 361/679.01 |
| 2013/0188327 A1* | 7/2013 | Lee | ................ | G09F 9/3026 361/807 |
| 2015/0181729 A1* | 6/2015 | Lewis | ................ | F16M 11/22 312/138.1 |
| 2016/0169456 A1* | 6/2016 | Yang | ................ | G09F 9/35 362/249.02 |

FOREIGN PATENT DOCUMENTS

| | | |
|---|---|---|
| CN | 105761628 A | 7/2016 |
| CN | 105864597 A | 8/2016 |
| CN | 206115910 U | 4/2017 |
| CN | 107578714 A | 1/2018 |
| KR | 20160062777 A | 6/2016 |

OTHER PUBLICATIONS

PCT Written Opinion of the International Searching Authority; Application No. PCT/CN2018/097199; dated Nov. 1, 2018; 4 pages.

* cited by examiner

INTELLIGENT LED DISPLAY

CROSS-REFERENCE TO RELATED APPLICATIONS

This application is a U.S. National Stage of International Patent Application No. PCT/CN2018/097199 filed on Jul. 26, 2018, which claims priority to Chinese Patent Application No. 201710965877.8 filed on Oct. 17, 2017, both of which are incorporated by reference herein as if reproduced in their entirety.

TECHNICAL FIELD

The present disclosure relates to the technical field of light emitting diode (LED) display devices, and more particularly to an intelligent LED display which may be maintained forward and backward and be fast assembled, supports intelligent connection of screens of the display, is light and slim, is integrated with receiving card and power supply, and has a power backup function.

BACKGROUND

With the maturing of technology of all aspects of LED display devices, there is a need for more high-definition pictures in the market; therefore, the demand of small-spacing LED displays is increased in a burst mode. The smaller the spacing is, the higher the resolution of a unit area is, and the clearer display images are. Meanwhile, since the required assembling precision is higher and higher, a box body needs to be rapidly maintained, the weight of the box body needs to be lighter, and the volume of the box body needs to be thinner. A single LED box body of an existing LED display device is formed by assembling an LED display module with an LED display box body frame, then, this LED box body and other box bodies are assembled to form a large screen, and finally these box bodies are fastened through a fixing structure. However, installation surface machining precision of the box body in the industry has reached the limit, this splicing method cannot meet the requirements of pre-maintenance and high precision simultaneously under the market situation of smaller and smaller dot spacing. When these box bodies are assembled together, accumulative errors between display modules and box bodies are larger; meanwhile, a wire rod is exposed so that an attractiveness of an assembled large screen may be influenced. Each single box body is provided with a power supply, so that the box body is heavy, the cost is high, and an assembly efficiency of screen of the display is influenced.

SUMMARY

The objective of embodiments of the present disclosure is to provide a hanging-type transverse fixed beam assembly structure or a seat-type transverse fixed beam assembly structure, which aims at solving a technical problem in the prior art that the LED display device equipped with the box body power box is too heavy.

In order to achieve the aforesaid objective, the present disclosure adopts the technical solutions as follows:

the present disclosure provides an intelligent LED display, including a unit display module assembly structure, a rear frame assembly structure and a transverse fixed beam assembly structure, wherein the transverse fixed beam assembly structure may either be a hanging-type transverse fixed beam assembly structure or be a seat-type transverse fixed beam assembly structure, the unit display module assembly structure is connected at the front of the rear frame assembly structure in a magnetic attraction manner so as to form an intelligent LED display unit, and the transverse fixed beam assembly structure is connected with the intelligent LED display unit in a hanging or seating manner.

The unit display module assembly structure includes a bottom shell component, a bottom shell cover component, a signal board, a module power, a HUB board component, a system card, a power socket, a smoke alarm module and a magnet, the bottom shell component is provided thereon with reservation holes respectively corresponding to the signal board, the module power, the system card, the power socket, the smoke alarm module and the magnet, and the bottom shell cover component and the magnet are fastened on a rear surface of the bottom shell component by screwing, the HUB board component is fastened on the front surface of the bottom shell component by screwing, the signal board, the module power, the system card, the power socket and the smoke alarm module are welded on a rear surface of the HUB board component and are exposed to a rear surface of the intelligent LED display through the reservation holes disposed on the bottom shell component, the PCBA is connected with a front surface of the HUB board component in a mutual insertion manner, and the PCBA is fastened with the bottom shell component by screwing.

The unit display module assembly structure is provided therein with a power input and a power output, a signal input and a signal output, and the module power adopts direct current input and output.

The module power in the unit display module assembly structure may convert direct current with high voltage into 5V direct current to supply power to an electronic component.

The system card in the unit display module assembly structure is integrated with the module power, and the module power is dual redundant.

The rear frame assembly structure includes a vertical beam component, an ironstone, an upper transverse beam component, a wire cover plate, a hanging pin lock rod component, a positioning stud, a hanging pin lock seat component and a lower transverse beam component, where the upper transverse beam component and the lower transverse beam component are vertically connected with the vertical beam component in a screw fastening manner, and the upper transverse beam component, the lower transverse beam component and the vertical beam component collectively form a frame configured to be magnetic to and fix the unit display module assembly structure, the ironstone is provided with threads and is fixedly connected with a front surface of the vertical beam component by screwing, and has a magnetic attraction fit with the unit display module assembly structure, the hanging pin lock rod component is fixed on the upper transverse beam component by screwing; the wire cover plate is connected with a sliding groove of the vertical beam component, the positioning stud is provided with threads and is connected with the vertical beam component, and is configured to serve as positioning during assembly; the hanging pin lock seat component is fastened on the lower transverse beam component by screwing; and the hanging pin lock rod component may be connected with the hanging pin lock seat component and serve as fastening and gap adjustment when intelligent LED display units and screens of the display are spliced together up and down.

The unit display module assembly structure is fixed on the vertical beam component of the rear frame assembly structure through a magnetic attraction, the unit module assembly structure arranged between two vertical beam frame columns may share the same vertical beam component, and an outer side of a unit module assembly structure located at a vertical beam frame column, other than the two vertical beam frame columns, does not share the vertical beam component with other unit module assembly structures, but is independently fixed on a frame of its own unit display module instead through the magnetic attraction or by screwing; and wherein the wire cover plate may cover a power source and a signal connection wire rod inside the vertical beam component which is between unit display modules.

The rear frame assembly structure may be an aluminum profile assembly frame, and may also be magnesium aluminum alloy or be other die casting material frames.

The transverse fixed beam assembly structure may be connected with the rear frame assembly structure in a hanging or seating manner.

The hanging-type transverse fixed beam assembly structure includes a hanging beam main part, a hanging beam locking block, a hanging beam gripper component and a hanging beam fine adjustment handle component, the hanging beam gripper component is fixed above the hanging beam main part by screwing and may be configured to connect the hanging beam main part with an external bracket, the hanging beam locking block is fixed below the hanging beam main part by screwing and is configured to match with the hanging pin lock rod component so as to connect the hanging beam main part with the intelligent LED display unit.

The seat-type transverse fixed beam assembly structure includes a seat beam main part, a seat beam locking block, a seat beam gripper component, a seat beam fine adjustment handle component, a seat beam rear bracket, a seat beam vertical bracket, a connection transverse beam, and a seat beam connecting piece, where the seat beam main part is fastened with the seat beam locking block by screwing, the seat beam locking block may be connected with the hanging pin locking rod component in a locking manner, so that the seat beam main part is connected below the intelligent LED display unit; the seat beam rear bracket is fixedly connected at the rear of the seat beam main part by screwing, the seat beam vertical bracket is fixedly connected above the seat beam rear bracket, and the connection transverse beam is fixedly connected at the rear of the above of at least one intelligent LED display unit to unify the intelligent LED display unit into one piece, the seat beam connecting piece is fixedly connected at the rear of the connection transverse beam and may fixedly connect the connection transverse beam with the seat beam vertical bracket; the seat beam fine adjustment handle component is fastened with the seat beam main part by screwing, when a large screen is assembled, spacing adjustment and gap adjustment may be achieved by adjusting the seat beam fine adjustment handle component. The seat beam gripper component is fastened with the seat beam main part by screwing, when the intelligent LED display is assembled into a seat-type, the seat beam gripper component may be fixedly connected with an external bracket so as to implement a seat-type intelligent LED display.

The present disclosure is implemented by assembling the unit display module assembly structure with the rear frame assembly structure, a box body power supply box is saved, display modules disposed on two adjacent columns share the same vertical beam, so that an accumulative error of assembly is reduced. A fine adjustment mechanism is mounted on the frame, so that the gap between the modules may be effectively adjusted. Module power is configured to convert and supply a direct-current power supply in each module, aluminum profile or other aluminum magnesium alloy materials are selected and used, so that the weight is reduced, a rapid maintenance is facilitated, and the appearance of the intelligent LED display is more attractive.

BRIEF DESCRIPTION OF THE DRAWINGS

In order to explain the embodiments of the present disclosure more clearly, a brief introduction regarding the accompanying drawings that need to be used for describing the embodiments of the present disclosure or the related art is given below; it is obvious that the accompanying drawings described as follows are only some embodiments of the present disclosure, for the person of ordinary skill in the art, other drawings may also be obtained according to the current drawings on the premise of paying no creative labor. In the drawings.

REFERENCE NUMERALS

01—unit display module assembly structure; 02—rear frame assembly structure; 03—hanging-type transverse fixed beam assembly structure; 04—seat-type transverse fixed beam assembly structure;

011—bottom shell component; 012—bottom shell cover component; 013—signal board; 014—module power; 015—HUB board component; 016—PCBA component; 017—system card; 018—power socket; 019—smoke alarm module; 020—magnet; 021—vertical beam component; 022—ironstone; 023—upper transverse beam component; 024—hanging pin lock rod component; 025—wire cover plate; 026—positioning stud; 027—hanging pin lock seat component; 028—lower transverse beam component;

031 hoisting beam main part; 032 hoisting beam locking block; 033 hoisting beam gripper component; 034 hoisting beam fine adjustment handle component; 041-seat beam rear bracket; 042-seat beam locking block; 043-seat beam gripper component; 044-seat beam fine adjustment handle component; 045-seat beam rear bracket; 046-seat beam vertical bracket; 047-seat beam connecting piece; 048-connection transverse beam.

DESCRIPTION OF THE EMBODIMENTS

In order to illustrate the technical solution in the embodiments of the present disclosure or the prior art, now, the present disclosure will be described more comprehensively hereinafter with reference to the accompanying drawings shown in the embodiments of the present disclosure. However, the present disclosure may be materialized in many different forms, and should not be interpreted as the limitation to the specific embodiments described herein. In contrast, these embodiments provide the person of ordinary skill in the art with the technical solutions of the present disclosure to facilitate the person of ordinary skill in the art to understand the technical solutions of the present disclosure, for the person of ordinary skill in the art, some other similar or equivalent technical solutions may be obtained according to these accompanying drawings without paying creative labor. Unless otherwise defined, the terms (including scientific and technological terms) used herein should be interpreted as having the same meaning as understood by the skilled person in the technical field to which the present disclosure belongs. It should also be understood that, the terms used herein should be interpreted as having the meanings consistent with the meanings of the terms in the contents of the specification and the related technology, and should not be interpreted in an idealized or an excessive manner, unless being so purposely limited herein.

Embodiment One

Figure 1:
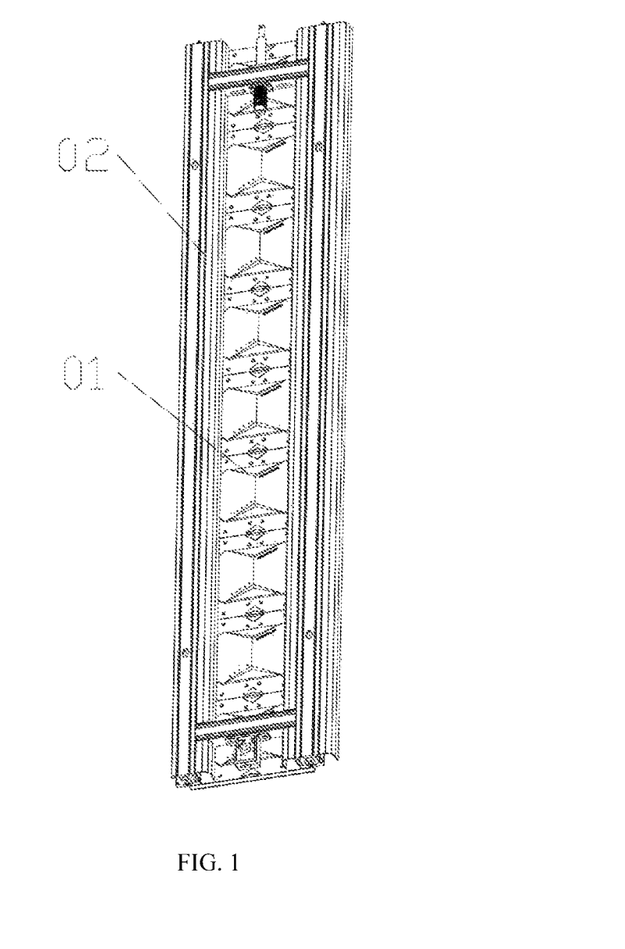
FIG. 1 depicts a three-dimensional diagram of an intelligent LED display unit.

FIG. 1 depicts a three-dimensional diagram of a single intelligent LED display unit according to the present disclosure. The intelligent LED display unit includes a unit display module assembly structure 01 and a rear frame assembly structure 02. The unit display module assembly structure 01 is connected with a front surface of the rear frame assembly structure 02 in a magnetic attraction manner, so that an intelligent LED display unit is formed.

Figure 2:
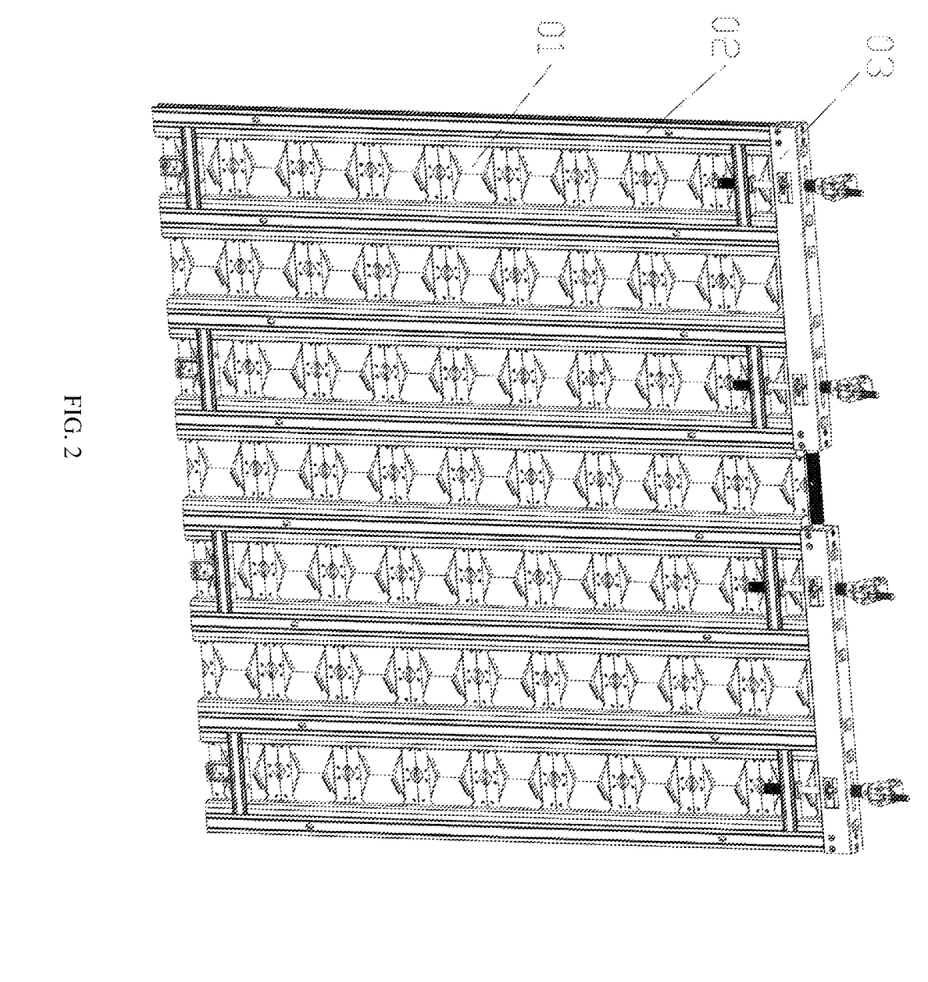
FIG. 2 depicts a three-dimensional diagram of a hanging-type intelligent LED display.

FIG. 2 depicts a three-dimensional diagram of a hoisting-type intelligent LED display according to the present disclosure, the hoisting-type intelligent LED display includes a unit display module assembly structure 01, a rear frame assembly structure 02 and a hoisting-type transverse fixed beam assembly structure 03, the unit display module assembly structure 01 and the rear frame assembly structure 02 are assembled into the intelligent LED display unit in the magnetic attraction manner, the hoisting-type transverse fixed beam assembly structure 03 is connected above the intelligent LED display unit and is fixedly arranged, so that a hoisting-type intelligent LED display is formed.

Figure 4:
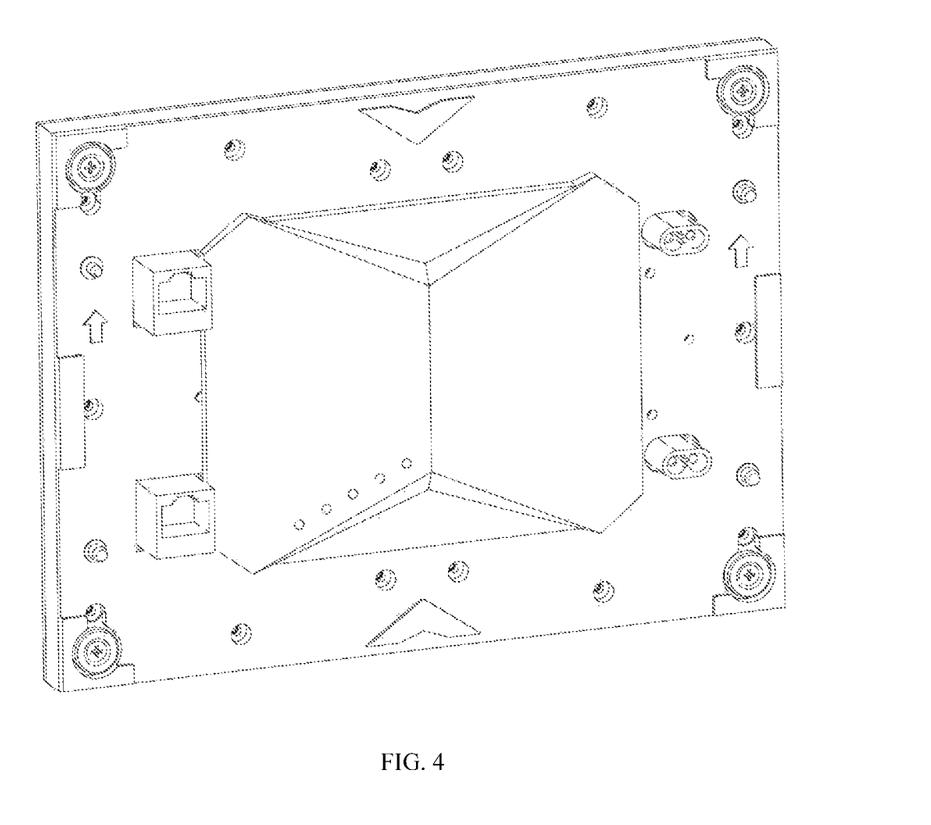
FIG. 4 depicts a three-dimensional diagram of a unit display module assembly structure.
Figure 5:
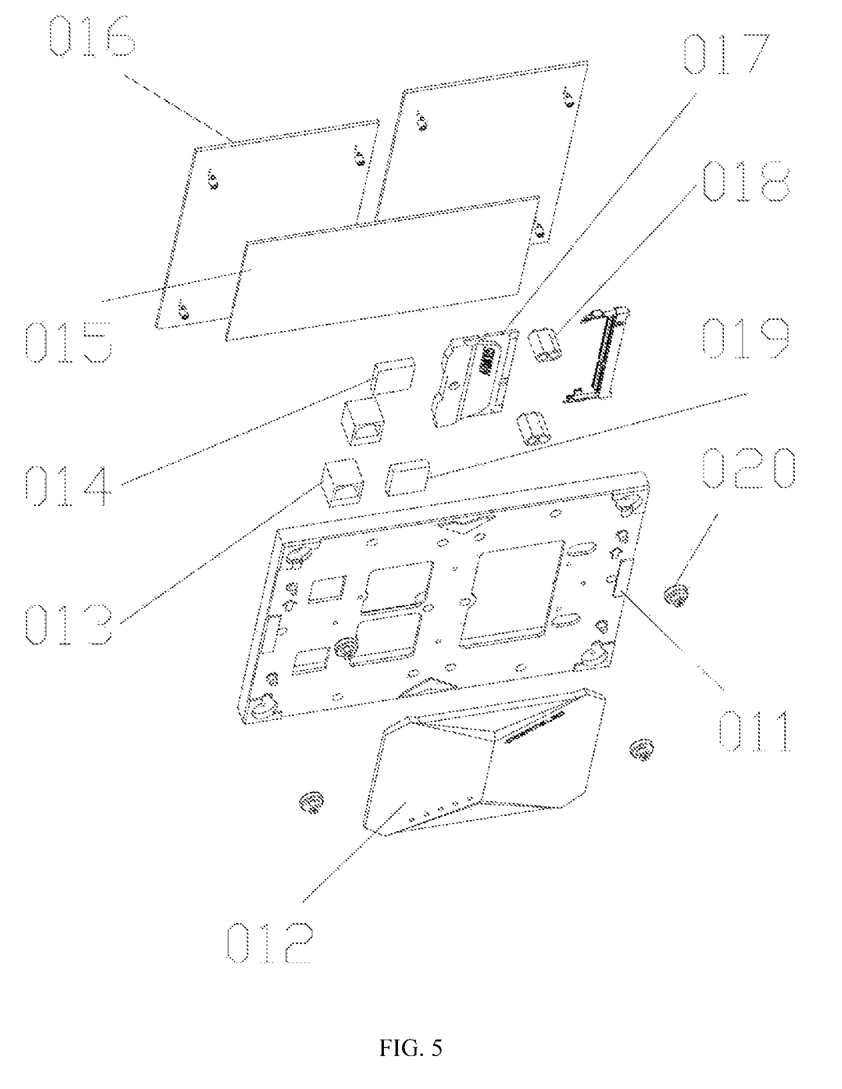
FIG. 5 depicts an exploded structural diagram of a unit display module assembly structure.

FIGS. 4-5 depict a three-dimensional diagram and an exploded structural diagram of the unit display module assembly structure 01 according to the present disclosure. A bottom shell component 011 is provided thereon with reservation holes respectively corresponding to the sizes of a signal board 013, a module power 014, a system card 017, a power socket 018, a smoke alarm module 019 and a magnet 020. The bottom shell cover component 012 and the magnet 020 are fastened on the rear surface of the bottom shell component 011 by screwing. A HUB board component 015 is fastened on the front surface of the bottom shell component 011 by screwing, and the signal board 013, the power socket 018, the system card 017 and the smoke alarm module 019 are welded on the rear surface of the HUB board component 015, and are all exposed to the rear surface of the intelligent LED display through the reservation holes disposed on the bottom shell component 011. A PCBA (Printed Circuit Board Assembly) component 016 is connected with the front surface of the HUB board component 015 in a mutual insertion manner, and the PCBA component 016 is fastened with the bottom shell component 011 by screwing.

Figure 6:
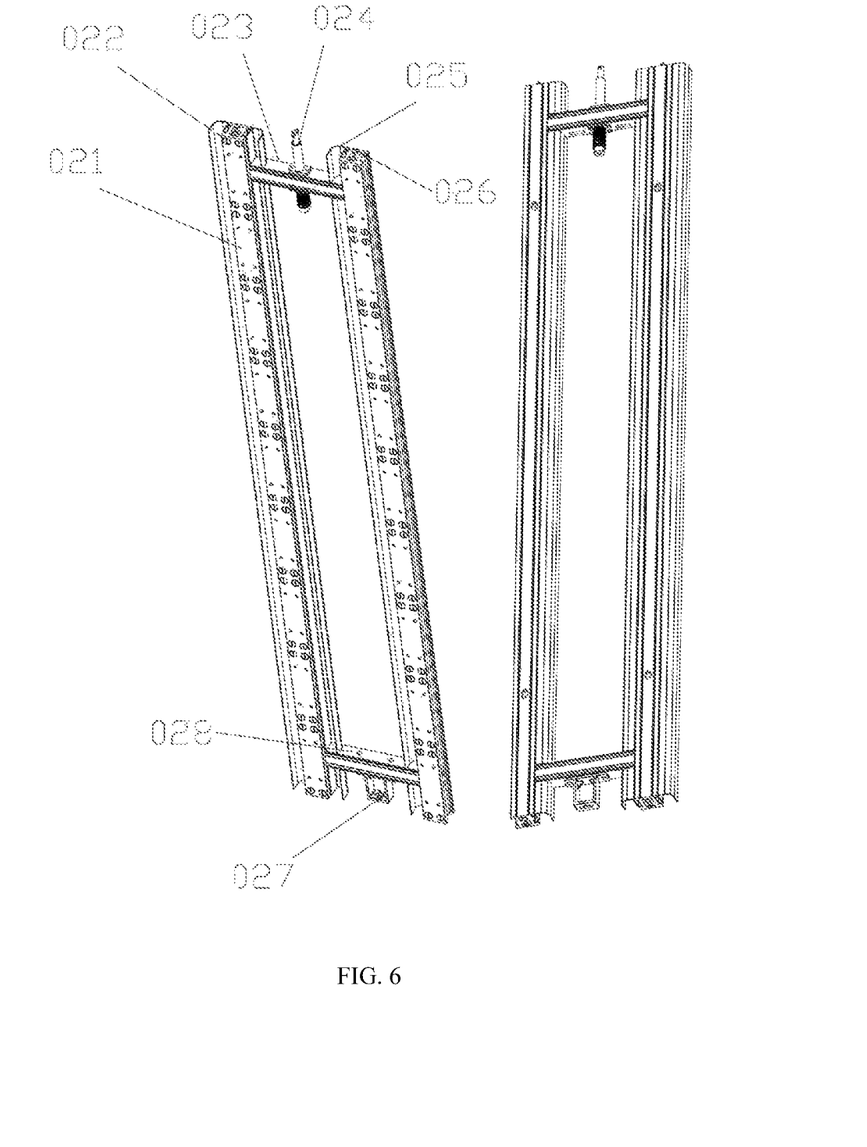
FIG. 6 depicts a front view and a rear view of a rear frame assembly structure.

FIG. 6 depicts a three-dimensional diagram of a front view and a rear view of a rear frame assembly structure 02 according to the present disclosure. Both an upper transverse beam component 023 and a lower transverse beam component 028 are fastened with a vertical beam component 021 by screwing and are fixed between two vertical beam components 021 to form a main part of the rear frame assembly structure 02. Ironstone 022 with threads is fastened on the vertical beam component 021 by screwing, and is in a magnetic attraction fit with the unit display module assembly structure 01. The hanging pin lock rod component 024 is fastened with the upper transverse beam component 023 by screwing. The hanging pin lock seat component 027 is fastened with the lower transverse beam component 028 by screwing. A wire cover plate 025 is connected with a sliding groove of the vertical beam component 021 and may cover the wire rod. A positioning stud 026 with screws is connected at the upper end of the vertical beam component 021 by screwing, and is configured to serve as positioning and controlling an assembling precision during assembly. When intelligent LED display units are spliced up and down, the hanging pin lock seat component 027 is connected with the hanging pin lock rod component 024 and plays the function of fastening and gap adjustment.

Figure 7:
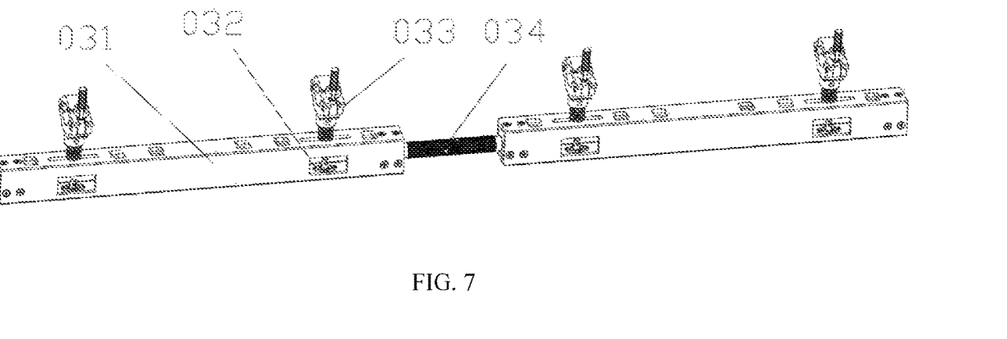
FIG. 7 depicts a three-dimensional diagram of a transverse fixed beam assembly structure of the hanging-type intelligent LED display screen.

FIG. 7 depicts a three-dimensional schematic view of a hoisting-type transverse fixed beam assembly structure 03 according to the present disclosure, a hoisting beam main part 031 is fastened with a hoisting beam locking block 032 by screwing, the hoisting beam locking block 032 may be connected with the hanging pin lock rod assembly 024 in a locking manner. A hoisting beam fine adjustment handle component 034 is connected between two hoisting beam main parts 03, when a large screen is spliced, gap adjustment may be realized by adjusting the hoisting beam fine adjustment handle component 034. The hoisting beam main part 031 is fastened with the hoisting beam gripper component 033 by screwing, when intelligent LED display is assembled into a hoisting-type, the hoisting beam gripper component 033 is connected with an external bracket, thereby implementing assembly of a hoisting-type intelligent LED display.

Embodiment Two

Figure 3:
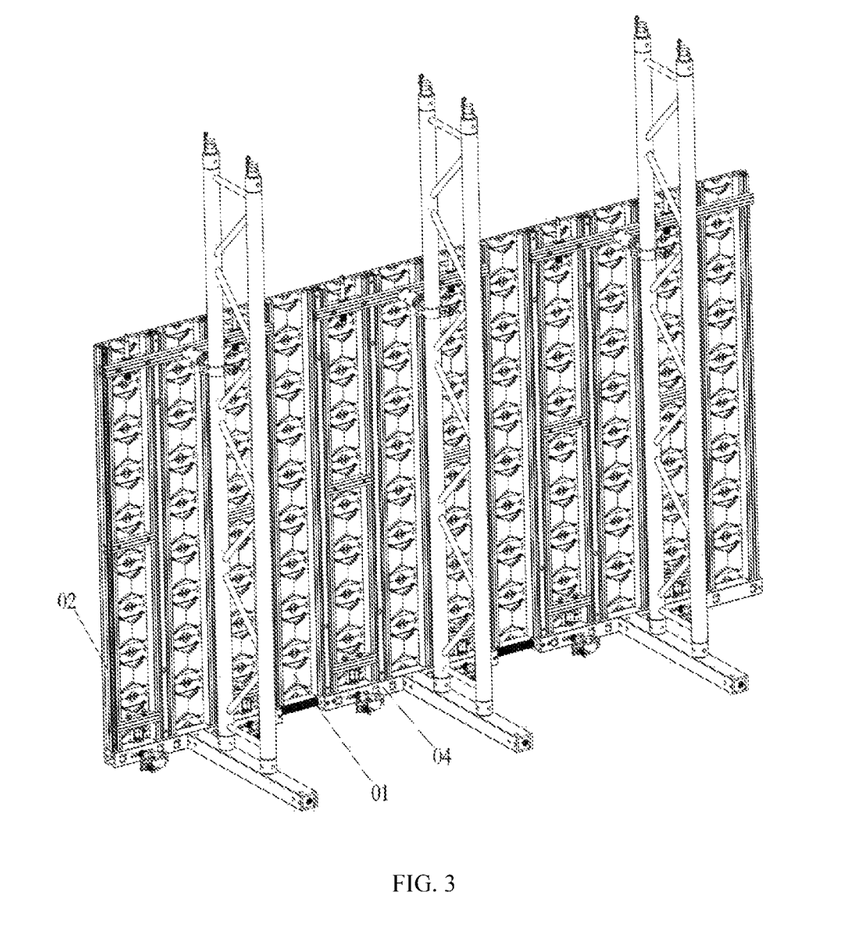
FIG. 3 depicts a three-dimensional diagram of seat-type intelligent LED display.

The unit display module assembly structure 01 and the rear frame assembly structure used for assembling the seat-type intelligent LED display is completely identical with the unit display module assembly structure 01 and the rear frame assembly structure used for assembling the hoisting-type intelligent LED display, the assembled intelligent LED display units are completely identical, either, it is not repeatedly described herein. The difference between the seat-type intelligent LED display and the hoisting-type intelligent LED display lies in the transverse fixed beam assembly structure, a hoisting-type transverse fixed beam assembly structure 03 is used in the hoisting-type intelligent LED display, however, a seat-type transverse fixed beam assembly structure 04 is used in the seat-type intelligent LED display.

FIG. 3 depicts a three-dimensional diagram of the seat-type intelligent LED display according to the present disclosure. The seat-type intelligent LED display includes a unit display module assembly structure 01, a rear frame assembly structure 02, and a seat-type transverse fixed beam assembly structure 04. The seat-type transverse fixed beam assembly structure 04 is connected below a plurality of intelligent LED display units, and is fixedly arranged so that the seat-type intelligent LED display is formed.

Figure 8:
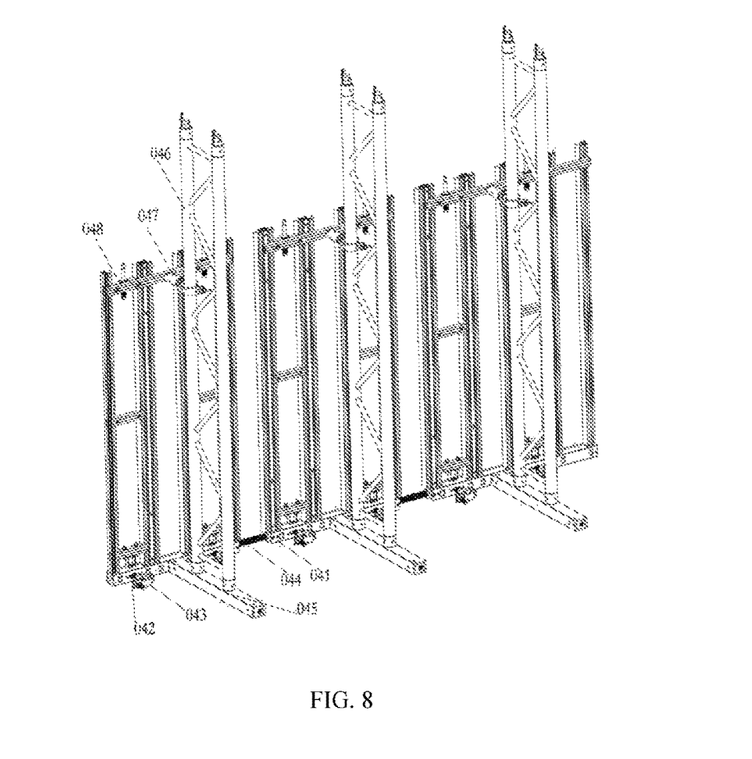
FIG. 8 depicts a three-dimensional diagram of an assembled structure of the seat-type transverse fixed beam assembly structure and the rear frame assembly structure of the hanging-type intelligent LED display screen.

FIG. 8 depicts a three dimensional diagram of an assembled structure of the seat-type transverse fixed beam assembly structure 04 and the rear frame assembly structure 02 according to the present disclosure. A seat beam main part 041 is fastened with a seat beam locking block 042 by screwing. The seat beam locking block 042 may be connected with the hanging pin lock rod component 024 in a locking manner so that the seat beam main part 041 is connected at the bottom of the intelligent LED display unit. A seat beam rear bracket 045 is firmly fixed at the rear of the seat beam main part 041 by screwing. A seat beam vertical bracket 046 is fixedly connected above the seat beam rear bracket 045, and a connection transverse beam 048 is fixedly connected at the rear of the above of the plurality of intelligent LED display units to unify the plurality of intelligent LED display units into one piece. The seat beam connecting piece 047 is fixedly connected at the rear of the connection transverse beam 048 so that the connection transverse beam 048 can be fixedly connected with the seat beam vertical bracket 046. The seat beam fine adjustment handle component 044 is fastened with the seat beam main part 041 by screwing, and when a large screen is assembled, spacing adjustment and gap adjustment may be achieved by adjusting the seat beam fine adjustment handle component 044. A seat beam gripper component 043 is fastened with the seat beam main part 041 by screwing, and when the intelligent LED display is assembled into a seat-type intelligent LED display, the seat beam gripper component 043 may be fixedly connected with the external bracket so as to implement a seat-type intelligent LED display.

What is claimed is:

1. An intelligent light emitting diode (LED) display, comprising:
    a rear frame assembly structure;
    a transverse fixed beam assembly structure, wherein the transverse fixed beam assembly structure is either a hanging-type transverse fixed beam assembly structure or a seat-type transverse fixed beam assembly structure; and
    a unit display module assembly structure connected at a front of the rear frame assembly structure in a magnetic attraction manner to form an intelligent LED display unit, wherein the transverse fixed beam assembly structure is connected with the intelligent LED display unit in a hanging or seating manner.

2. The intelligent light emitting diode (LED) display of claim 1, wherein the unit display module assembly structure comprises:
    a bottom shell cover component;
    a signal board;
    a module power;
    a system card;
    a power socket;
    a smoke alarm module;
    a magnet; and
    a bottom shell component comprises reservation holes corresponding to the signal board, the module power, the system card, the power socket, the smoke alarm module and the magnet,
    wherein the bottom shell cover component and the magnet are fastened on a rear surface of the bottom shell component by screwing.

3. The intelligent light emitting diode (LED) display of claim 2, wherein the unit display module assembly structure further comprises a HUB board component, wherein the HUB board component is fastened on a front surface of the bottom shell component by screwing, and wherein the signal board, the module power, the system card, the power socket, and the smoke alarm module are welded on a rear surface of the HUB board component and are exposed to a rear surface of the intelligent LED display through the reservation holes disposed on the bottom shell component.

4. The intelligent light emitting diode (LED) display of claim 3, wherein the unit display module assembly structure further comprises a Printed Circuit Board Assembly (PCBA) component, wherein the rear surface of the bottom shell component is provided with a positioning stud capable of controlling an assembly precision, wherein the PCBA component is connected with a front surface of the HUB board component in an insertion manner, and wherein the PCBA component is fastened with the bottom shell component by screwing.

5. The intelligent light emitting diode (LED) display of claim 4, wherein the unit display module assembly structure comprises a power input, a power output, a signal input and a signal output, and wherein the module power adopts direct current input and output and is configured to convert direct current with high voltage into 5V direct current to supply power to an electronic component.

6. The intelligent light emitting diode (LED) display of claim 4, wherein the system card of the unit display module assembly structure is integrated with the module power, and wherein the module power is dual redundant.

7. The intelligent light emitting diode (LED) display of claim 1, wherein the rear frame assembly structure comprises a vertical beam component, an upper transverse beam component, and a lower transverse beam component, wherein the upper transverse beam component and the lower transverse beam component are vertically connected with the vertical beam component in a screw fastening manner, and wherein the upper transverse beam component, the lower transverse beam component, and the vertical beam component collectively form a frame configured to be magnetically affixed to the unit display module assembly structure.

8. The intelligent light emitting diode (LED) display of claim 7, wherein the rear frame assembly structure further comprises an ironstone with threads, and wherein the ironstone with threads is fixedly connected with a front surface of the vertical beam component by screwing and has a magnetic attraction fit with the unit display module assembly structure.

9. The intelligent light emitting diode (LED) display according to of claim 8, wherein the rear frame assembly structure further comprises a hanging pin lock rod component, a wire cover plate, a positioning stud, and a hanging pin lock seat component, wherein the hanging pin lock rod component is fixed on the upper transverse beam component by screwing, wherein the wire cover plate is connected with a sliding groove of the vertical beam component, wherein the positioning stud is provided with threads and is connected with the vertical beam component, wherein the hanging pin lock seat component is fastened on the lower transverse beam component by screwing; and wherein the hanging pin lock rod component is connected with the hanging pin lock seat component when intelligent LED display units and screens of the display are spliced together up and down.

10. The intelligent light emitting diode (LED) display of claim 9, wherein the unit display module assembly structure is fixed on the vertical beam component of the rear frame assembly structure through a magnetic attraction, wherein the unit display module assembly structure which is arranged between two vertical beam frame columns shares the vertical beam component, wherein an outer side of a unit display module assembly structure which is located at another vertical beam frame column rather than the two vertical beam frame columns does not share the vertical beam component with other unit display module assembly structures, the outer side of the unit display module assembly structure which is located at another vertical beam frame column is independently fixed on a frame of the unit display module assembly structure which is located at another vertical beam frame column through the magnetic attraction or by screwing, and wherein the wire cover plate covers a power source and a signal connection wire rod inside the vertical beam component which is between unit display modules.

11. The intelligent light emitting diode (LED) display of claim 9, wherein the rear frame assembly structure is an aluminum profile assembly frame and is made of a magnesium aluminum alloy or other die casting material frames.

12. The intelligent light emitting diode (LED) display of claim 9, wherein the hanging-type transverse fixed beam assembly structure comprises a hanging beam main part, a hanging beam locking block, a hanging beam gripper component, and a hanging beam fine adjustment handle component, wherein the hanging beam gripper component is fixed above the hanging beam main part by screwing and is configured to connect the hanging beam main part with an external bracket, and wherein the hanging beam locking block is fixed below the hanging beam main part by screwing and is configured to match with the hanging pin lock rod component, so that the hanging beam main part is connected with the intelligent LED display unit.

13. The intelligent light emitting diode (LED) display of claim 9, wherein the seat-type transverse fixed beam assembly structure comprises a seat beam main part and a seat beam locking block, wherein the seat beam main part is fastened with the seat beam locking block by screwing, and wherein the seat beam locking block is connected with the hanging pin lock rod component in a locking manner, so that the seat beam main part is connected below the intelligent LED display unit.

14. The intelligent light emitting diode (LED) display of claim 13, wherein the seat-type transverse fixed beam assembly structure further comprises a seat beam rear bracket, a seat beam vertical bracket and a connection transverse beam, wherein the seat beam rear bracket is fixedly connected at a rear surface of the seat beam main part by screwing, wherein the seat beam vertical bracket is fixedly connected above the seat beam rear bracket, and wherein the connection transverse beam is fixedly connected at the rear surface of at least one intelligent LED display unit, which makes the at least one intelligent LED display unit unified into one piece.

15. The intelligent light emitting diode (LED) display of claim 14, wherein the seat-type transverse fixed beam assembly structure further comprises a seat beam gripper component, a seat beam fine adjustment handle component, and a seat beam connecting piece, wherein the seat beam connecting piece is fixedly connected at a rear surface of the connection transverse beam and is configured to fixedly connect the connection transverse beam with the seat beam vertical bracket, wherein the seat beam fine adjustment handle component is fastened with the seat beam main part by screwing, wherein the seat beam gripper component is fastened with the seat beam main part by screwing, and wherein when the intelligent LED display is assembled into a seat-type intelligent LED display, the seat beam gripper component is fixedly connected with an external bracket so as to implement the seat-type transverse fixed beam assembly structure.

* * * * *